United States Patent
Richter et al.

(10) Patent No.: US 11,086,803 B2
(45) Date of Patent: Aug. 10, 2021

(54) DYNAMICALLY CONFIGURING TRANSMISSION LINES OF A BUS

(71) Applicant: Micron Technology, Inc., Boise, ID (US)

(72) Inventors: Michael Dieter Richter, Ottobrunn (DE); Thomas Hein, Munich (DE); Martin Brox, Munich (DE); Peter Mayer, Neubiberg (DE); Wolfgang Anton Spirkl, Germering (DE)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 16/579,515

(22) Filed: Sep. 23, 2019

(65) Prior Publication Data

US 2020/0110714 A1   Apr. 9, 2020

Related U.S. Application Data

(60) Provisional application No. 62/741,845, filed on Oct. 5, 2018.

(51) Int. Cl.
   *G06F 11/00*   (2006.01)
   *G08C 25/00*   (2006.01)
   (Continued)

(52) U.S. Cl.
   CPC ........ *G06F 13/1668* (2013.01); *G06F 3/0607* (2013.01); *G06F 3/0635* (2013.01);
   (Continued)

(58) Field of Classification Search
   None
   See application file for complete search history.

(56) References Cited

U.S. PATENT DOCUMENTS

| | | |
|---|---|---|
| 8,205,028 B1 | 6/2012 | Sakarda |
| 2004/0019738 A1 | 1/2004 | Kahn et al. |
| 2016/0092392 A1 | 3/2016 | Yong et al. |

FOREIGN PATENT DOCUMENTS

| | | |
|---|---|---|
| KR | 20120001771 A | 1/2012 |
| KR | 20180092149 A | 8/2018 |

OTHER PUBLICATIONS

ISA/KR, International Search Report and Written Opinion of the International Searching Authority, Int'l Appl. No. PCT/US2019/052839, dated Jan. 16, 2020, Korean Intellectual Property Office, Seo-gu, Daejeon, Republic of Korea, 9 pgs.

*Primary Examiner* — Guerrier Merant
(74) *Attorney, Agent, or Firm* — Holland & Hart LLP

(57) ABSTRACT

Methods, systems, and devices for dynamically configuring transmission lines of a bus between two electronic devices (e.g., a controller and memory device) are described. A first device may determine a quantity of bits (e.g., data bits, control bits) to be communicated with a second device over a data bus. The first device may partition the data bus into a first set of transmission lines (e.g., based on the quantity of data bits) and a second set of transmission lines (e.g., based on the quantity of control bits). The first device may communicate the quantity of data bits over the first set of transmission lines and communicate the quantity of control bits over the second set of transmission lines. In some cases, the first device may repartition the data bus based on different quantities of data bits and control bits to be communicated with the second device at a different time.

24 Claims, 11 Drawing Sheets

(51) Int. Cl.
   *H03M 13/00* (2006.01)
   *H04L 1/00* (2006.01)
   *G06F 13/16* (2006.01)
   *G06F 3/06* (2006.01)
   *G06F 11/10* (2006.01)
(52) U.S. Cl.
   CPC .......... *G06F 3/0659* (2013.01); *G06F 3/0673* (2013.01); *G06F 11/1004* (2013.01)

DYNAMICALLY CONFIGURING TRANSMISSION LINES OF A BUS

CROSS REFERENCE

The present application for patent claims priority to U.S. Provisional Patent Application No. 62/741,845 by Richter et al., entitled "DYNAMICALLY CONFIGURING TRANSMISSION LINES OF A BUS," filed Oct. 5, 2018, which is assigned to the assignee hereof and is expressly incorporated by reference in its entirety.

BACKGROUND

The following relates generally to a system that includes at least one memory device and more specifically to dynamically configuring transmission lines of a bus.

Memory devices are widely used to store information in various electronic devices such as computers, wireless communication devices, cameras, digital displays, and the like. Information is stored by programming different states of a memory device. For example, binary devices may store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source.

Data buses may be used to transfer signals between a controller and a memory device. But in some cases, a data bus may be under-utilized. Solutions for increasing the utilization of data buses may be desired.

DETAILED DESCRIPTION

Figure 1:
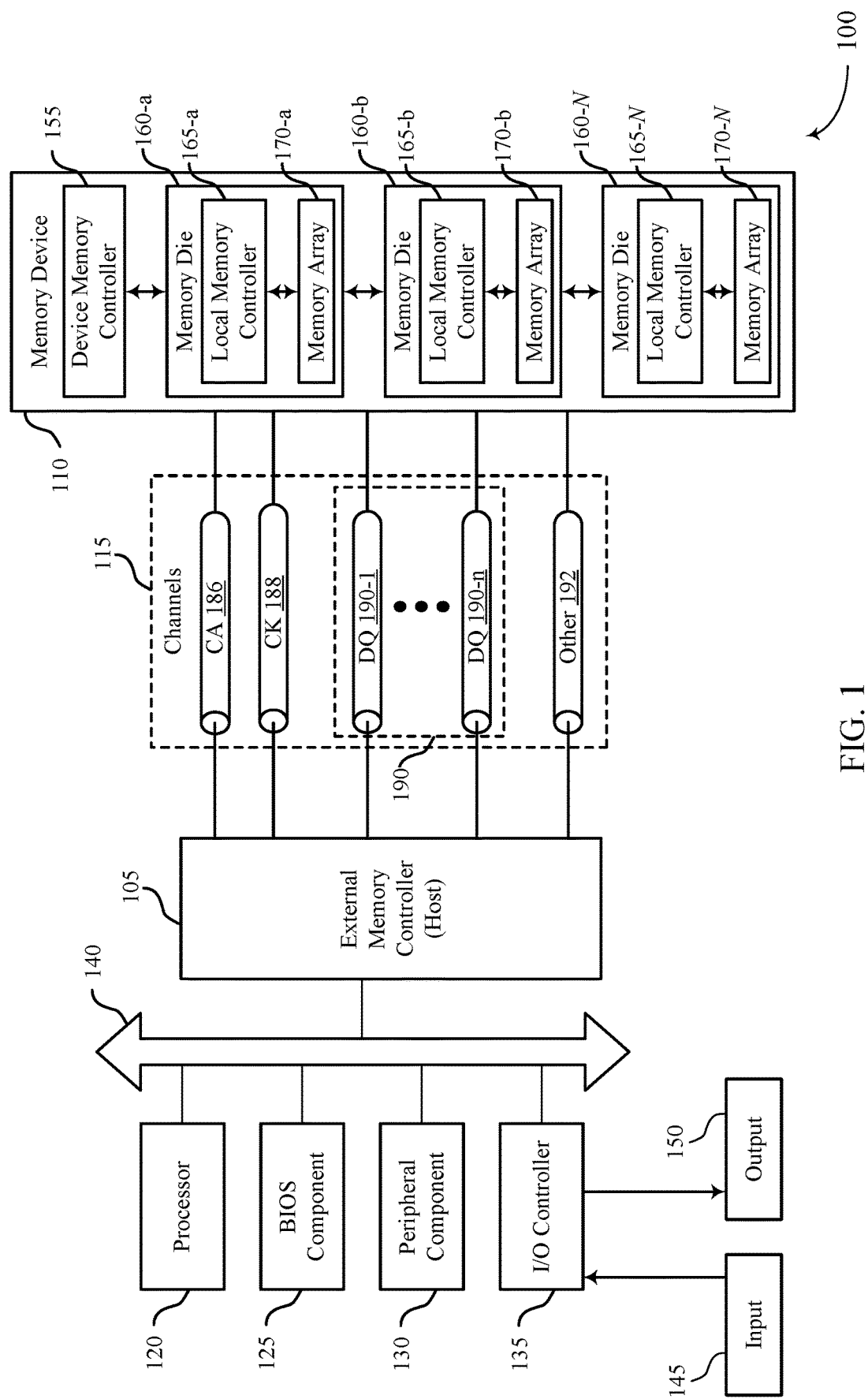
FIG. 1 illustrates an example of a system that uses one or more memory devices as disclosed herein.

A memory controller may dynamically configure some transmission lines of a data bus to carry data bits and other transmission lines to carry control bits (e.g., based on the quantity of data and control content to be communicated with a memory device such as, for example, DRAM). When the quantity of data and control content changes, one or more devices may re-configure the transmission lines of the data bus to accommodate the new quantities so that the data bus can be adaptable and configured dynamically.

A device may include multiple data buses for exchanging control and data content between two components, such as a memory device and processing unit (e.g., between DRAM and a memory controller, such as a graphics processing unit (GPU), general purpose GPU (GPGPU), or central processing unit (CPU)). In general, some of the data buses may be configured to communicate control content and the rest of the data buses may be configured to communicate data content. But in some cases, the data content to be communicated may be communicated by a fraction of a bus capacity configured to carry data bits, and the control information may be communicated by a fraction of a bus capacity configured to carry control bits. In such cases, the efficiency of the buses may be reduced compared to when the buses are run at capacity, which may introduce latency into the system that negatively impacts user experience and system performance.

According to the techniques described herein, a first device (e.g., a controller) may determine the quantity of control bits, the quantity of data bits, or both to be exchanged with a second device (e.g., a memory device) so that the transmission lines of a data bus can be suitably allocated for each type of content. For example, when the ratio of control bits to data bits changes, the first device may reconfigure the data bus so that the quantity of transmission lines allocated for each type of content accommodates the change in the amount of data or control information. For example, if the ratio of control bits to data bits increases, the first device may increase the quantity of transmission lines used to transfer control information by selecting one or more of the transmission lines previously used to transfer data and switching these one or more transmission lines to transfer control information. As another example, if the ratio of control bits to data bits decreases, the first device may increase the quantity of transmission lines used to transfer data by selecting one or more of the transmission lines previously used to transfer control information and switching these one or more transmission lines to transfer control information.

In other systems, control content may be transmitted at a slower data rate than data content for reliability purposes. When such systems use separate data buses for control and data content, the quantity of control transmission lines may be relatively large so that the reduced data rate does not slow down data communication. Because each input/output (I/O) node corresponding to a transmission line requires space on a die (e.g., for driver and receiver circuitry, as well as electrostatic discharge (ESD) protection), large quantities of transmission lines dedicated to control traffic can unnecessarily increase the footprint of a memory device.

According to the techniques described herein, the quantity of data buses dedicated to control traffic (and thus the corresponding circuitry footprint) may be reduced by configuring a bus (e.g., a data bus) so that some of its transmission lines can carry control traffic and the rest can carry data traffic. The control traffic and data traffic may be sent at the same data rate, in some examples, which may reduce the complexity of the system. To ensure the reliability of the control traffic, however, the control traffic may be secured with error protection. For example, the control traffic may be transmitted with parity or cyclic redundancy check (CRC) information that a receiving device can use to detect errors in the control traffic.

Features of the disclosure introduced above are further described with reference to FIGS. 1 through 3 in the context of memory devices, systems, and circuits that support configurable transmission lines within a data bus. Specific examples are then described with reference to FIGS. 4 through 6, which illustrate different configurations of transmission lines within a data bus. These and other features of the disclosure are further described with respect to FIGS. 7 through 12 which illustrate process flows, apparatus diagrams, and flowcharts that support dynamically configuring transmission lines of a bus.

FIG. 1 illustrates an example of a system 100 that uses one or more memory devices as disclosed herein. The system 100 may include an external memory controller 105, a memory device 110, and a plurality of channels 115 that couple the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be a component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. An access command may, in some cases, be a command that prompts a memory device to store or read data from one or more memory cells. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be coupled with or in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a GPU, a GPGPU, or a system on a chip (SoC), among other examples.

In some cases, the processor 120 may be incorporated into or part of the external memory controller 105. In some cases, the processor 120 may be a GPU that may include an I/O section with output drivers (e.g., off-chip drivers (OCDs)). Alternatively, the GPU may include or be connected to a DSP, which may replace, or be complementary to, the OCDs. The processor 120 may perform aspects of configuring bus transmission lines (e.g., data bus transmission lines) as described herein. For example, the processor 120 may divide a data bus into two sets of transmission lines: a first set to transfer control signals, and a second set to transfer data signals. If the quantity of data and control signals to be transferred changes, the processor 120 may reassign or reconfigure transmission lines from one set to another set to increase the efficiency and use of the bus.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component (s) 130 may be other components as would be understood by persons of ordinary skill in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that may provide information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include output driver circuitry and various other circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are further described with reference to FIG. 2.

The memory arrays 170 may be examples of two-dimensional (2D) arrays of memory cells or may be examples of a three-dimensional (3D) arrays of memory cells. For example, a 2D memory device may include a single memory die 160. A 3D memory device may include two or more memory dice 160 (e.g., memory die 160-*a*, memory die 160-*b*, and/or any quantity of memory dice 160-N). In a 3D memory device, multiple memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs, increase the performance of the memory array, or both. In some 3D memory devices, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may perform, or facilitate, aspects of configuring data bus transmission lines as described herein. For example, the device memory controller 155 may receive control and data signals over multiple different sets of transmissions lines that may be part of a data bus. When the two sets of transmission lines are reconfigured, the device memory controller 155 may receive control and/or data signals over the reconfigured transmission lines.

The device memory controller 155 may be configured to communicate with the external memory controller 105, the one or more memory dice 160, or the processor 120. In some cases, the memory device 110 may receive data and/or control signals (e.g., commands and addresses) from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, encoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, commands/and/or addresses between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. The data clock signal may provide timing for multi-level signals sent over channels 115. For example, the data clock may provide timing information for determining the duration of symbol periods of a multi-level signal.

In some cases, the external memory controller 105 or other components of the system 100, or its functions described herein, may be implemented by the processor 120. For example, the external memory controller 105 may be hardware, firmware, or software, or some combination thereof implemented by the processor 120 or other component of the system 100. Although the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more nodes at external memory controller 105 and one or more pins or pads at the memory device 110. A node may be an example of a conductive input or output point of a device of the system 100, and a node may be configured to act as part of a transmission line. In some cases, a node of a terminal may be part of a signal path of the channel 115.

Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170). A signal path may be implemented using one or more types of transmission lines, including differential transmission lines and single-ended transmission lines.

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured to adjust (e.g., oscillate) between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. For example, the channels 115 may include data channels 190-1 through 190-$n$. Each data channel may be associated with or include one or more transmission lines. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., non-return-to-zero (NRZ), PAM4).

In some cases, the channels 115 may include one or more other channels 192 that may be dedicated to other purposes. These other channels 192 may include any quantity of signal paths. In some cases, the other channels 192 may include one or more write clock signal (WCK) channels. Although the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK.

The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths.

The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

Signals communicated over the channels 115 (and their associated transmission lines) may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, NRZ, unipolar encoding, bipolar encoding, Manchester encoding, pulse amplitude modulation (PAM) having two symbols (e.g., PAM2), PAM4, and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a PAM4 symbol may represent a logic 00, a logic 01, a logic 10, or a logic 11). Examples of multi-symbol modulation schemes include, but are not limited to, PAM4, PAM8, quadrature amplitude modulation (QAM), quadrature phase shift keying (QPSK), and others. A multi-symbol signal (e.g., a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, a transmitting device that communicates via channels 115 may select a data bus that includes multiple channels (and thus multiple transmission lines). The device may dynamically configure the transmission lines of the data bus so that different sets of transmission lines are used to transfer control information and data depending on the quantity of one or more types of content.

Figure 2:
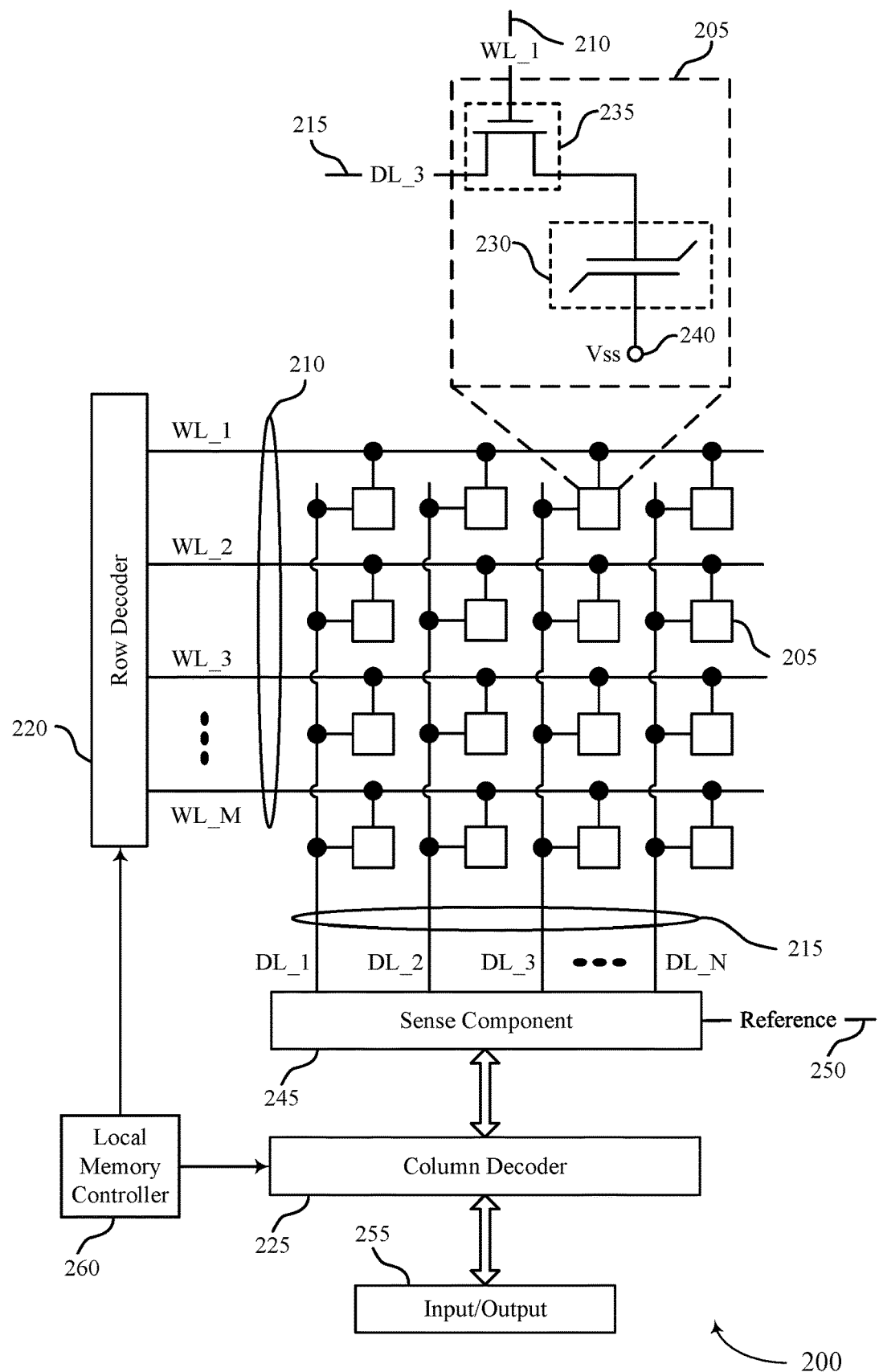
FIG. 2 illustrates an example of a memory device in accordance with various examples disclosed herein.

FIG. 2 illustrates an example of a memory device 200 in accordance with various examples disclosed herein. The memory device 200 may be an example of the memory device 110 or memory dice 160 described with reference to FIG. 1. In some cases, the memory device 200 may be referred to as a memory chip or an electronic memory apparatus. The memory device 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor 230. In DRAM architectures, a memory cell 205 may include a capacitor 230 that includes a dielectric material to store a charge representative of the programmable state. In other memory architectures, other storage devices and components are possible. For example, nonlinear dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory device 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection. The memory device 200 may include a quantity of memory banks, at least some of which, if not each of which, may have a unique address and which may include a multitude of rows and columns.

Accessing the memory cells 205 in a memory bank may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory device 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes (e.g., ceases) electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 may be or include a transistor and its operation may be controlled by applying a voltage to the transistor gate, where the voltage differential between the transistor gate and transistor source may be greater or less than a threshold voltage of the transistor. In some cases, the switching component 235 may be or include a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that may be used to perform access operations on the memory cell 205. In some architectures, the word line 210 may be in electronic communication with a gate of a switching component 235 of a memory cell 205 and may be configured to control the switching component 235 of the memory cell 205. In some architectures, the word line 210 may be in electronic communication with a node of the capacitor 230 of the memory cell 205 and the memory cell 205 may not include a switching component 235.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0.

The sense component 245 may include various transistors or amplifiers to detect and amplify a difference in the signals. In some cases, the sense component 245 may be part of another component (e.g., a column decoder 225, row decoder 220). In some cases, the sense component 245 may be in electronic communication with the row decoder 220 or the column decoder 225

The detected logic states of memory cells 205, as determined by the sense component 245 as one example, may be output through column decoder 225 as output 255. Output 255 may pass the detected logic states to one or more intermediary components (e.g., a local memory controller) for transfer over one or more channels (e.g., for transmission over one or more transmission lines). Thus, the detected logic state of memory cells 205 may be conveyed to devices or components external to memory device 200. For example, the detected logic states may be transferred (e.g., to an external memory controller 105) via one or more transmission lines.

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory device 200, perform one or more operations on the memory device 200, and communicate data from the memory device 200 to the external memory controller 105 (or the device memory controller 155) in response to performing the one or more operations.

The memory device 200 may send data to and receive data from one or more external devices via a bus (e.g., a data bus) that includes multiple transmission lines. As described herein, the memory device 200 may use different combinations of the transmission lines to transfer control signals and data signals. The memory device 200 may modify the combinations of transmission lines (e.g., based on a quantity of content to be transferred) so that some transmission lines previously used or previously configured to transfer data may be used or configured to transfer control signals, and vice versa. The quantity of transmission lines selected to transfer a type of content (e.g., control content or data content) may be related to (e.g., proportional to) the quantity of content.

The local memory controller 260 may generate row and column address signals to activate the target word line 210 and the target digit line 215. The local memory controller 260 may also generate and control various voltages or currents used during the operation of the memory device 200. In general, the amplitude, shape, or duration of an applied voltage or current discussed herein may be adjusted or varied and may be different for the various operations discussed in operating the memory device 200.

In some cases, the local memory controller 260 may be configured to perform a write operation (e.g., a programming operation) on one or more memory cells 205 of the memory device 200. The write operation may be for data received from an external device. During a write operation, a memory cell 205 of the memory device 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a first signal (e.g., voltage) to the digit line 215 during the write operation to store a first state (e.g., charge) in the capacitor 230 of the memory cell 205, and the first state (e.g., charge) may be indicative of a desired logic state.

In some cases, the local memory controller 260 may be configured to perform a read operation (e.g., a sense operation) on one or more memory cells 205 of the memory device 200. The read operation may be for data requested by, or intended for, an external device. During a read operation, the logic state stored in a memory cell 205 of the memory device 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205.

The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor 230 of the target memory cell 205. The local memory controller 260 may perform a re-write operation or a refresh operation to return the memory cell to its original logic state. The local memory controller 260 may re-write the logic state to the target memory cell 205 after a read operation. In some cases, the re-write operation may be considered part of the read operation. Additionally, activating a single access line, such as a word line 210, may disturb the state stored in some memory cells 205 in electronic communication with that access line. Thus, a re-write operation or refresh operation may be performed on one or more memory cells 205 that may not have been accessed.

The memory device 200 illustrates a two-dimensional (2D) array of memory cells 205. In some cases, the memory device may include three-dimensional (3D) arrays or memory cells 205. A 3D memory array may include two or more 2D memory arrays stacked on top of one another. In some cases, 2D memory arrays in a 3D memory array may be referred to as decks, levels, layers, or dies. A 3D memory array may include any quantity of stacked 2D memory arrays (e.g., two high, three high, four high, five high, six high, seven high, eight high). This may increase the quantity of memory cells 205 that may be positioned on a single die or substrate as compared with a single 2D memory array, which in turn may reduce production costs, increase the performance of the memory array, or both. In some 3D memory arrays, different decks may share at least one common access line such that some decks may share at least one of a word line 210 or a digit line 215.

Figure 3:
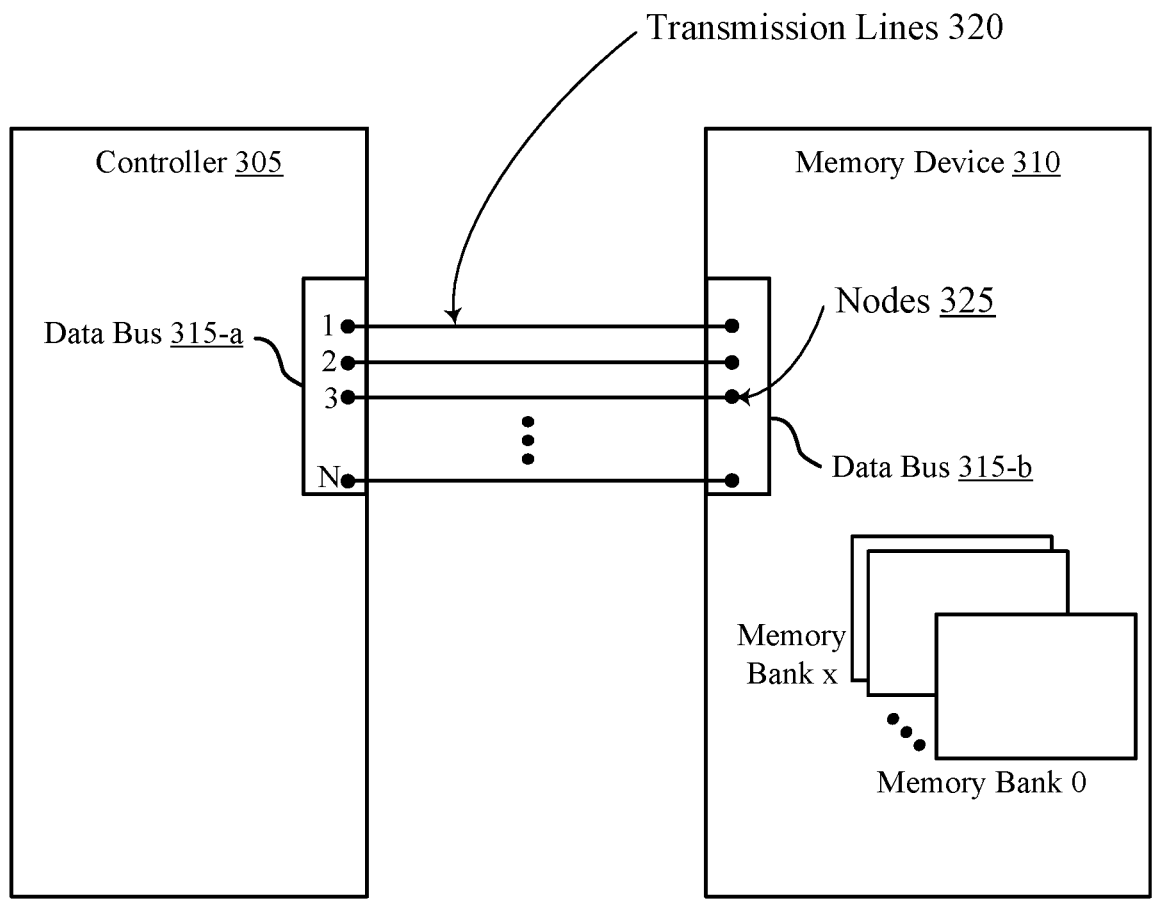
FIG. 3 illustrates an example of a system in accordance with various examples disclosed herein.

FIG. 3 illustrates a system 300 in accordance with various examples disclosed herein. System 300 may be an example of a system 100 described with reference to FIG. 1. System 300 may include a controller 305 and a memory device 310. The controller 305 may be an example of an external memory controller 105 (also referred to as a host, host controller, or host device) or a processor 120 (e.g., a GPU, a GPGPU, a CPU), as described with reference to FIG. 1. The memory device 310 may be an example of a memory device 110, device memory controller 155, memory die 160, or local memory controller 165 as described with reference to FIG. 1. The controller 305 may be in electronic communication with or coupled with a bus, such as data bus 315-a, and memory device 310 may be in electronic communication with or coupled with another bus, such as data bus 315-b. The data buses 315, as one example of the buses disclosed herein, may each include transmission lines 320, and may be coupled to the transmission lines 320 via nodes 325. Although only one data bus 315 is shown, controller 305 and memory device 310 may include multiple data buses 315, and the techniques described herein can be implemented using any quantity of different buses 315.

As shown in system 300, transmission lines 320 may originate at one component (e.g., controller 305) and terminate at another component (e.g., memory device 310) which may or may not be within the same device. The origination and termination points may be referred to as nodes 325 (or, among other alternatives, pins, pads, terminals, transmission line interfaces, interface components, or connection points) and may provide an interface between the transmission lines 320 and the transmitting and receiving components. For example, the nodes 325 may be made of a conductive material that is capable of transferring current or voltage to and from the transmission lines 320 and controller 305 (and/or memory device 310). Thus, the nodes may connect (e.g., physically or electrically or both) the transmission lines 320 to the greater electrical networks of the controller 305 and memory device 310.

The controller 305 may control operations of the memory device 310 by sending control signals to the memory device 310 via the transmission lines 320, which may connect counterpart data buses 315-a and 315-b. The term "data bus" may refer to a quantity of nodes 325 and corresponding transmission lines 320 that are operated in tandem to communicate a set of commands, addresses, and/or data. Although shown with a fixed width of N nodes 325 and N transmission lines 320, data bus 315-a (and 315-b) may each have a configurable width. For example, controller 305 may adjust the width of data bus 315-a (and consequently data bus 315-b) to include greater than or less than N nodes 325 and N transmission lines 320.

Memory device 310 may store information in the memory cells of memory banks (e.g., in memory banks 0 through x). The memory cells may be arranged in the memory banks in sets of rows and columns as described with reference to FIG. 2. Thus, to target a particular memory cell for a memory operation, memory device 310 may need to identify or be directed to the bank, column, and row of the memory cell at issue. The bank, column, and row associated with the memory cell may be indicated or represented by addresses. For example, the bank that includes the memory cell may be associated with a bank address ("BA"), the column that includes the memory cell may be associated with a column address ("CA"), and the row that includes the memory cell may be indicated by the row address ("RA").

Each of the addresses described herein (e.g., BA, CA, and RA) may be represented by a quantity of control bits (e.g., a quantity of address bits). For example, when memory device 310 includes sixteen (16) banks, and each of those banks includes one hundred and twenty-eight (128) columns and 16384 rows (e.g., as in a 16 Gb GDDR6 architecture or an 8 Gb GDDR5 architecture), the bank address may be represented by four address bits, the column address may be represented by seven address bits, and the row address may be represented by fourteen address bits. In another example (e.g., in a 16 Gb DDR4×16 architecture), memory device 310 may include eight (8) banks, and each of those banks includes 1024 columns and 131072 rows, in which case the bank address may be represented by three address bits, the column address may be represented by ten address bits, and the row address may be represented by 17 address bits. However, these are illustrative examples and other quantities of address bits may be used and are specifically contemplated.

To access data stored by memory device 310 (or to store information in memory device 310), controller 305 may transmit command and address signals to memory device 310. The address signals may include the bank address, column address, and row address of one or more target memory cell(s), and the command signals may include commands for memory operations (such as activate, read, write, pre-charge, refresh, and training operations) to be performed by memory device 310 on the target memory cell(s). A memory operation may refer to an operation (e.g., an action that the memory device 310 takes) that manipulates one or more memory cells, access lines (e.g., word lines, digit lines, or plate lines), or memory banks. An access operation may refer to a subset of memory operations that involve or result in data being written to or read from a memory cell in memory device 310.

In one example of a memory operation, an activate ("ACT") command may indicate to the memory device 310 that a row of memory cells is to be activated in preparation for or in conjunction with another memory operation (e.g., a read or write operation). Activating a memory cell may refer to energizing the word line corresponding to that memory cell. When an activate command is transferred to memory device 310, the activate command may include or be followed by a quantity of address bits that indicate the bank targeted for an upcoming read or write operation, as well as the row within that bank that is to be activated. Thus, a transmitted activate command may include or be followed by the bank and row addresses relevant to the upcoming memory operation. Controller 305 may transmit an activate command each time a new bank is targeted for a read operation, or each time a new row in the same bank is targeted for a write operation.

In an example of an access operation, a read ("RD") command may indicate to the memory device 310 that one or more memory cells are to undergo a read operation so that their stored information (e.g., as represented by logic states) can be transferred to controller 305. Reading a memory cell may refer to the process of applying a voltage across the memory cell so that the memory cell discharges onto a digit line for sensing. When a read command is transmitted to memory device 310, the read command may include or be followed by the bank address and column address of the memory cell(s) targeted for the read operation. In some cases, the read command may also indicate the quantity of memory cells that are to be read, starting at an initial address point. The quantity of memory cells to be read in response to a read command may be referred to as the read burst length.

In another example of an access operation, a write command (WR) may indicate to memory device 310 that one or more memory cells are to undergo a write operation so that information from controller 305 can be stored in one of the memory banks of memory device 310. Writing a memory cell may refer to the process of applying a voltage across the memory cell so that the memory cell charges to a state indicative of a logic one or zero. When a write command is transmitted to memory device 310, the write command may include or be followed by the bank address and column address of the memory cell(s) targeted for the write operation. In some cases, the write command may also indicate the quantity of memory cells that are to be written, starting at an initial address point. The quantity of memory cells to be written in response to a write command may be referred to as the write burst length.

Although described with reference to activate, read, and write commands, variations of these commands, and other different commands, can be used with the described techniques disclosed herein.

Each command for a memory operation may be represented by a quantity of control bits. Thus, the total quantity of bits for a memory operation (referred to as x bits) may be the quantity of control bits plus the quantity of address bits. But x bits may not fill up a traditional data bus dedicated to control traffic. This is because, in some cases, the width of a data bus may be designed to accommodate the maximum quantity of control bits needed to initiate a memory operation, which means that the data bus may be under-utilized when an operation involves less than the configured (e.g., maximum) quantity of control bits. For example, the control bits for a read or write operation may occupy a fraction of the nodes of a data bus that may be designed to accommodate the control bits for an activate command, leaving some nodes unused.

According to the techniques described herein, a system can increase the efficiency of its data buses by dynamically configuring (or reconfiguring) some of the transmission lines of the data buses 315 to carry control content and the others to carry data content. The quantity of transmission lines selected to carry control content may be based on (e.g., proportional) to the quantity of control bits to be transferred, and the quantity of transmission lines selected to carry data content may be based on (e.g., proportional) to the quantity of data bits to be transferred for some examples. Thus, each transmission line of a data bus may carry content during a transfer operation of information between two devices.

Figure 4:
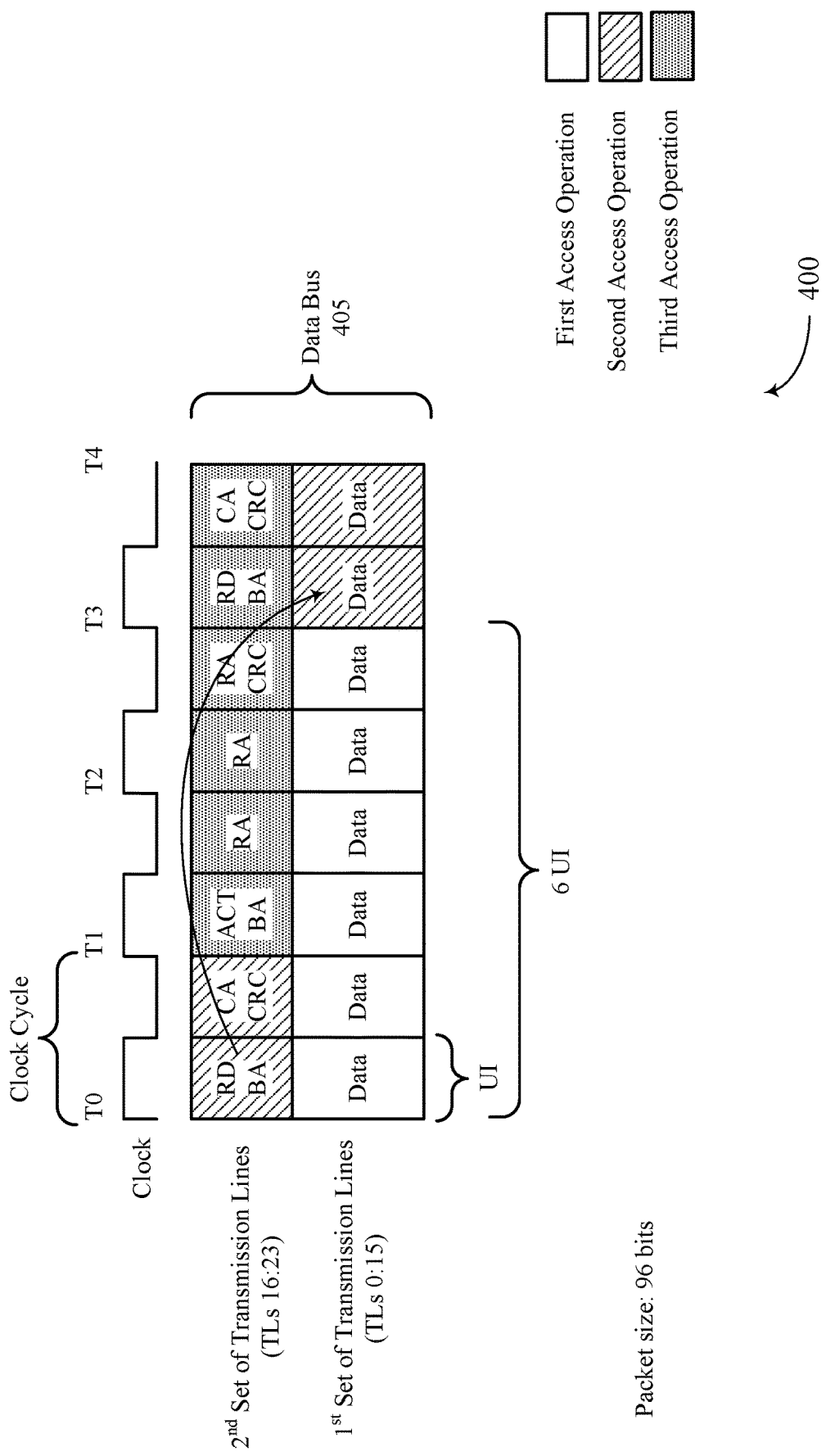
FIGS. 4 through 6 illustrate examples of timing diagrams in accordance with various examples disclosed herein.

FIG. 4 illustrates a timing diagram 400 in accordance with various examples disclosed herein. The timing diagram 400 may represent the commands, addresses, and data transferred over a data bus 405, which may be an example of a data bus 315 described with reference to FIG. 3. Data bus 405 may include a quantity (e.g., twenty-four (24)) of transmission lines ("TLs") and corresponding nodes. Although described with reference to 24 transmission lines, the techniques described herein can be implemented using a data bus of any width.

According to the techniques described herein, a memory controller that has been requested to retrieve information from a memory device may determine the quantity of data bits to be retrieved (e.g., read) for a read operation and the quantity of control bits needed to facilitate one or more subsequent memory operations. The quantity of data bits to be retrieved or stored per access operation may be referred to herein as the packet size. In the example shown in timing diagram 400, the memory controller may determine that there are ninety-six (96) data bits to be retrieved (e.g., the packet size is 96) as part of a first access operation and that 64 control bits are to be transferred to facilitate subsequent access operations (e.g., a second access operation and third access operation, which in this case are read operations). In some cases, the memory controller may also determine the width of the data bus (e.g., the quantity of transmission lines or nodes included in the data bus 405).

Based on the quantities of data and control bits, and the quantity of transmission lines, the memory controller may divide the data bus into a first set of transmission lines (e.g., transmission lines 0 through 15) and a second set of transmission lines (e.g., transmission lines 16 through 23). Thus, the data bus 405 may be divided into sixteen (16) transmission lines for data content and eight (8) transmission lines for control content. The data bus 405 may be divided so that the second set of transmission lines is transferring control content for an upcoming access operation while the first set of transmission lines is transferring data content for a previous access operation.

For example, the first set of transmission lines may be selected to transfer the requested data (e.g., the 96 data bits) from the memory device and the second set of transmission lines may be selected to transfer control signals (e.g., forty-eight (48) control bits) to the memory device. Because there are 16 transmission lines in the first set of transmission lines, 16 data bits can be transferred over data bus 405 per unit interval (UI), and 32 data bits can be transferred every clock cycle. Thus, the 96 data bits may be transferred over six (6) UIs (or three (3) clock cycles). Similarly, because there are eight transmission lines in the second set of transmission lines, eight control bits can be transferred over data bus per UI, and 16 control bits can be transferred every clock cycle. Thus, the 48 control bits may be transferred over six UIs (or three clock cycles).

To facilitate the upcoming read operation (a second access operation that starts, for example, in clock cycle T3), a read command (which may be preceded by an activate command) and bank address may be transferred during the first UI, and a column address and CRC may be transferred during the second UI. Thus, the control content for the second access operation may be transferred over the second set of transmission lines during clock cycle T0. This means that the second set of transmission lines may be available to carry control content for a third access operation during T1, T2, and T3, because during this time the remaining 64 bits of data corresponding to the first access operation are being transferred over the first set of transmission lines. After the last bit of data for the first access operation is transferred over the first set of transmission lines (e.g., after T2), the memory device can start transferring (or receiving) new data content associated with the second access operation over the first set of transmission lines.

Because the control content for the second access operation is transferred in clock cycle T0, the second set of transmission lines is available to carry control content for a third access operation during clock cycles T1 though T3. Thus, the second set of transmission lines do not go unused while the data from the first access operation finishes transferring. For example, a third read operation may be set up during T1 through T3 by transferring over the second set of transmission lines an activate command, bank address, and row address during T1, a row address and CRC during T2, and a read command, bank address, column address, and CRC during T3. Thus, each transmission line of data bus 405 may be used to carry traffic during each UI of the four clock cycles (e.g., T0 through T3), resulting in improved (e.g., 100%) utilization of data bus 405.

In some systems, there may be a limit on the quantity of activate commands that can be issued within a certain amount of time. There may also be restrictions on the timing of various commands relative to one another. The restrictions may be a result of technical limitations of materials, architectures, or configurations. For instance, technical constraints may impose a delay between, for example, an activate command and a read or write command (e.g., so that the targeted bank can open the targeted row(s)). In some cases, such delays may be imposed by industry standards (e.g., to accommodate technical constraints or other aspects mandated by the standards).

A delay (e.g., an optional or mandatory delay) may be referred to as a timing parameter or command delay parameter and may represent a period of time or quantity of clock cycles between transferring a particular command and performing some other action. To reduce the latency of an access operation, a memory controller may allocate the transmission lines of a data bus so that commands associated with mandatory delays can be transmitted in a manner that effectively hides those delays. For example, a memory controller may partition the sets of transmission lines so that activate and read/write commands are properly dispersed in the time domain and so that the UIs between activate commands and corresponding read/write commands are filled with meaningful control content (e.g., read and write commands for other banks targeted by previous activate commands).

As discussed, a controller (e.g., a memory controller, a host controller) may select sets of transmission lines based on the packet size of data to be retrieved (or stored). However, in some cases a given packet size may prevent the controller from optimizing the data bus 405. In such cases, the controller may select a packet size for access operations that allows the controller (or another component, in some examples) to split or configure the data bus in a manner that increases utilization of the transmission lines.

For example, a controller that has been previously used or configured to use a first packet size for one or more access operations may switch to using or be configured to use a second packet size for one or more upcoming access operations. Thus, a memory controller may modify the packet size used for access operations on a dynamic basis. Similarly, the memory controller may modify the read burst length for read operations or write burst length for write operations (e.g., the memory controller may modify, compared to a previous read command, the quantity of memory cells to be read in response to a subsequent read command).

The control information for memory operations may be secured using error detection bits so that the control information can be sent at the same data rate as the data information without adversely impacting accuracy or other parameters. When information is corrupted during propagation, the error detection bits may indicate that the corruption has occurred, and in some cases point to the bit(s) of information that have been corrupted. Thus, error detection bits may be used to secure information. In the example shown in FIG. 4, the control information is secured using CRC. In other cases, however, the control information may be secured using some other mechanism or technique. For example, the control information may be secured using parity bits. Thus, the control information may be secured using a set of error detection bits (e.g., CRC bit or parity bits). Error detection bits may also be referred to as "error correction bits" or "error detection and correction bits."

Figure 5:
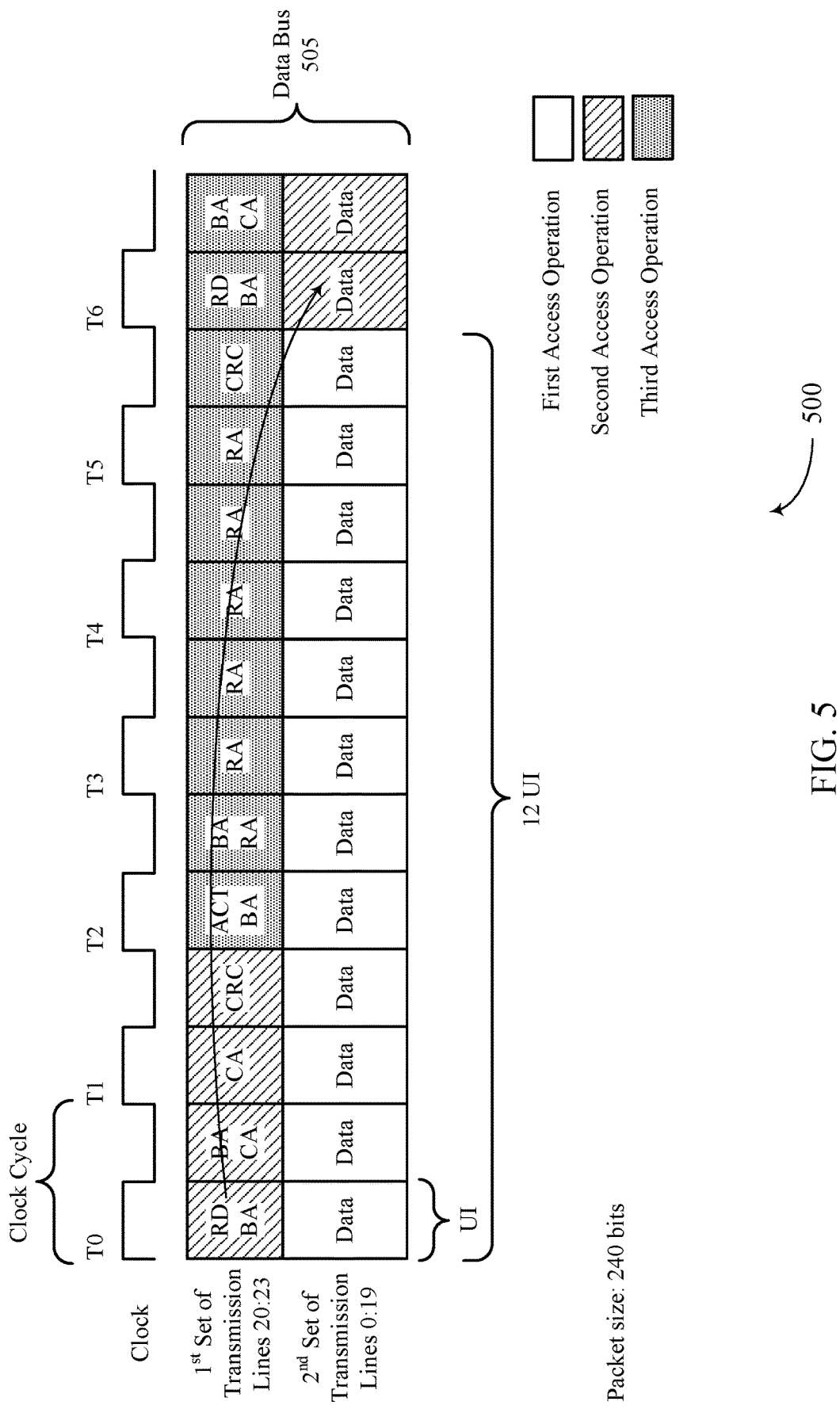

FIG. 5 illustrates a timing diagram 500 in accordance with various examples disclosed herein. The timing diagram 500 may represent the commands, addresses, and data transferred over a data bus 505. Data bus may be an example of new configuration of data bus 405, as described with reference to FIG. 4. For example, data bus 505 may represent a new configuration of data bus 405 after the memory controller has repartitioned or reconfigured data bus 405 based on new quantities of data and control content. Or data bus 505 may represent an initial configuration of a data bus, or a configuration of a data bus before it is repartitioned or reconfigured as shown in data bus 405. The data bus 505 may represent a data bus that connects a controller to a memory device.

If data bus 505 is a new configuration of data bus 405, the controller may communicate with the memory device to facilitate transition to the new configuration. For example, the controller may determine that the quantity of data and control bits associated with one or more upcoming memory operations is different than the quantity of data and control bits associated with one or more previous memory operations. In response to such a determination, the controller may repartition or reconfigure data bus 405 so that it is configured as data bus 505. The controller may transmit information indicating the repartitioning or reconfiguring to the memory device so that the memory device can initiate appropriate action (e.g., prepare to receive content over the repartitioned or reconfigured data bus 505). For example, the memory device may determine that the data bus 505 has been partitioned into a first set of transmission lines and a second set of transmission lines.

According to the techniques described herein, data bus 505 may be dynamically partitioned into a first set of transmission lines (transmission lines 0:19) and a second set of transmission lines (e.g., transmission lines 20:23). Thus, the data bus 505 may be divided into a first set of twenty (20) transmission lines and a second set of four (4) transmission lines. The division of data bus 505 may be based on at least one of, if not both of, the quantities of data bits and control bits (and/or other information) associated with a memory device. For example, the division of data bus 505 may be based on the quantity of data bits to be transferred to the memory device for a first access operation and the quantity of control bits to be transferred to the memory device for one or more access operations following the first access operation. In this example, the quantity of data bits to be transferred (e.g., the packet size for a read or write operation) during the first six (6) clock cycles (e.g., T0 through T5) may be two hundred and forty (240) bits and the quantity of control bits to be transferred (e.g., for two read operations) may be forty-eight (48) bits.

Based on these quantities, the controller may partition the data bus 505 so that each transmission line is used to convey content in each UI of the six clock cycles used to transfer the data content. For example, while data for the first access operation is being transferred over the first set of transmission lines during clock cycles T0 and T1, control content for a second access operation (e.g., a read operation starting in clock cycle T6) may be transferred over the second set of transmission lines. And while data for the first access operation is being transferred over the first set of transmission lines during clock cycles T2 through T5 (and data for the second access operation is being transferred during clock cycle T6), control content for a third access operation (e.g., another read operation) may be transferred over the second set of transmission lines. In some examples, some of the control content (e.g., an activate (ACT) command and corresponding address(es)) for the second access operation may be transmitted prior to clock cycle T0. Thus, each transmission line of data bus 505 may be used to carry traffic during each UI of the seven clock cycles (e.g., T0 through T6), resulting in 100% utilization of data bus 505 during those cycles.

Figure 6:
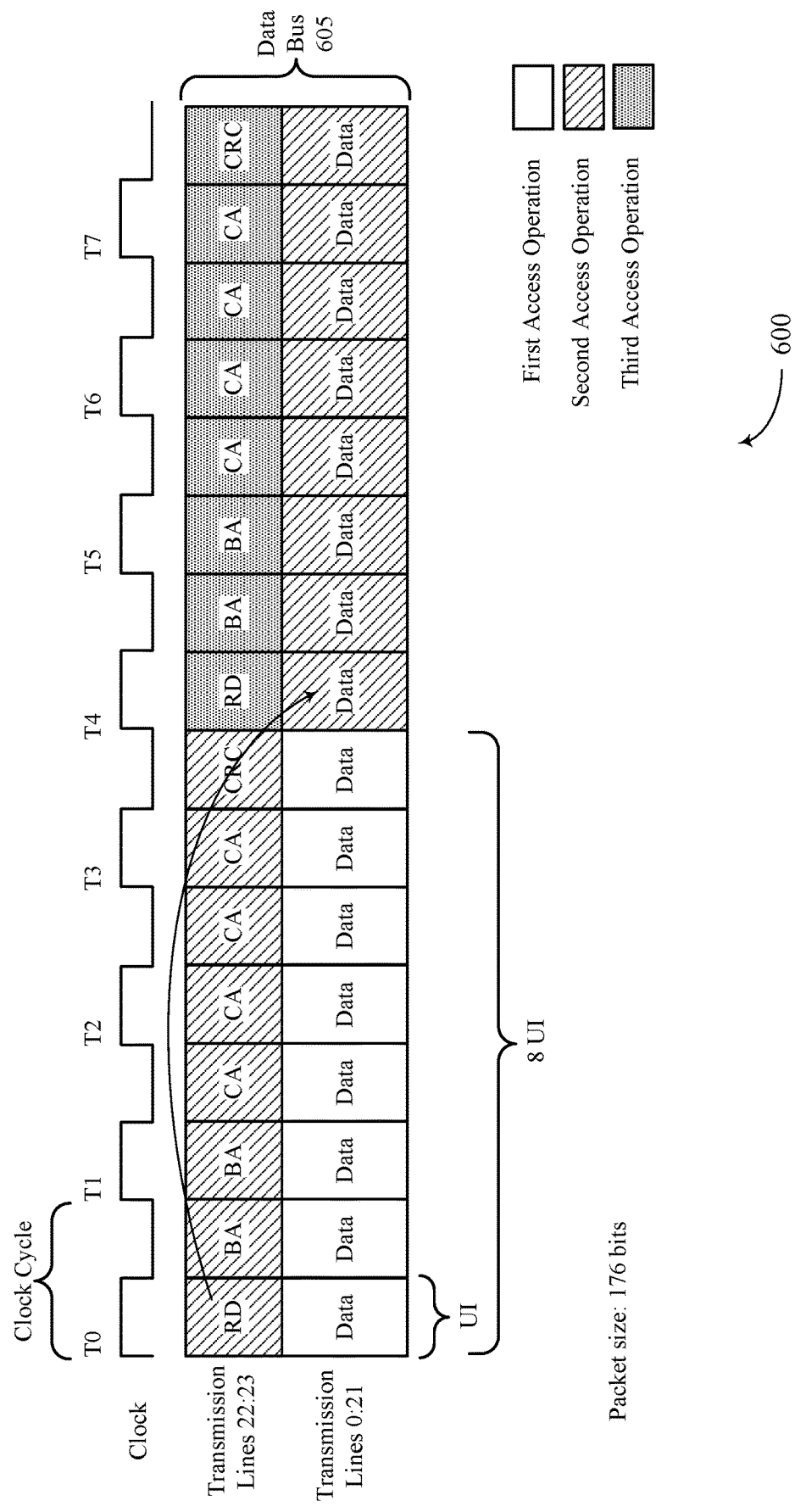

FIG. 6 illustrates a timing diagram 600 in accordance with various examples disclosed herein. The timing diagram 600 may represent the commands, addresses, and data transferred over a data bus 605. Data bus may be an example of new configuration of data bus 405 or 505, as described with reference to FIGS. 4 and 5, respectively. For example, data bus 605 may represent a new configuration of data bus 405 (or 505) after the controller has repartitioned data bus 405 (or 505) based on new quantities of data and control content.

According to the techniques described herein, data bus 605 may be split into a first set of transmission lines (transmission lines 0:21) and a second set of transmission lines (e.g., transmission lines 22:23). Thus, the data bus 605 may be divided into a first set of twenty-two (22) transmission lines and a second set of two (2) transmission lines. The division of data bus 605 may be adapted to the packet size of a read or write operation so that all of the transmission lines in data bus 605 are used to convey content while the data associated with the read or write operation is being exchanged between the memory controller and another device (e.g., a memory device). For example, if the packet size is one hundred and seventy-six (176) bits, the data bus 605 may be partitioned so that each transmission line is in use during the four clock cycles (e.g., T0 through T3) scheduled for communicating the data content.

Thus, while data for a first access operation is being transferred over the first set of transmission lines during clock cycles T0 through T3, control content for a second access operation (e.g., a read operation starting in clock cycle T4) may be transferred over the second set of transmission lines (e.g., concurrently, simultaneously). Similarly, while data for the second access operation is being transferred over the first set of transmission lines during clock cycles T4 through T7, control content for a third access operation (e.g., another read operation) may be transferred over the second set of transmission lines. In some examples, some of the control content (e.g., an ACT command and corresponding address(es)) for the second access operation may be transmitted prior to clock cycle T0. Thus, each transmission line of data bus 605 may be used to carry traffic during each UI of the eight (8) UIs used to convey the data content for the first access operation, resulting in 100% utilization of data bus 605 during those UIs. Indeed, in this example, all the transmission lines of data bus 605 are used to convey content in the UIs shown, resulting in 100% utilization of data bus 605 during those UIs.

Figure 7:
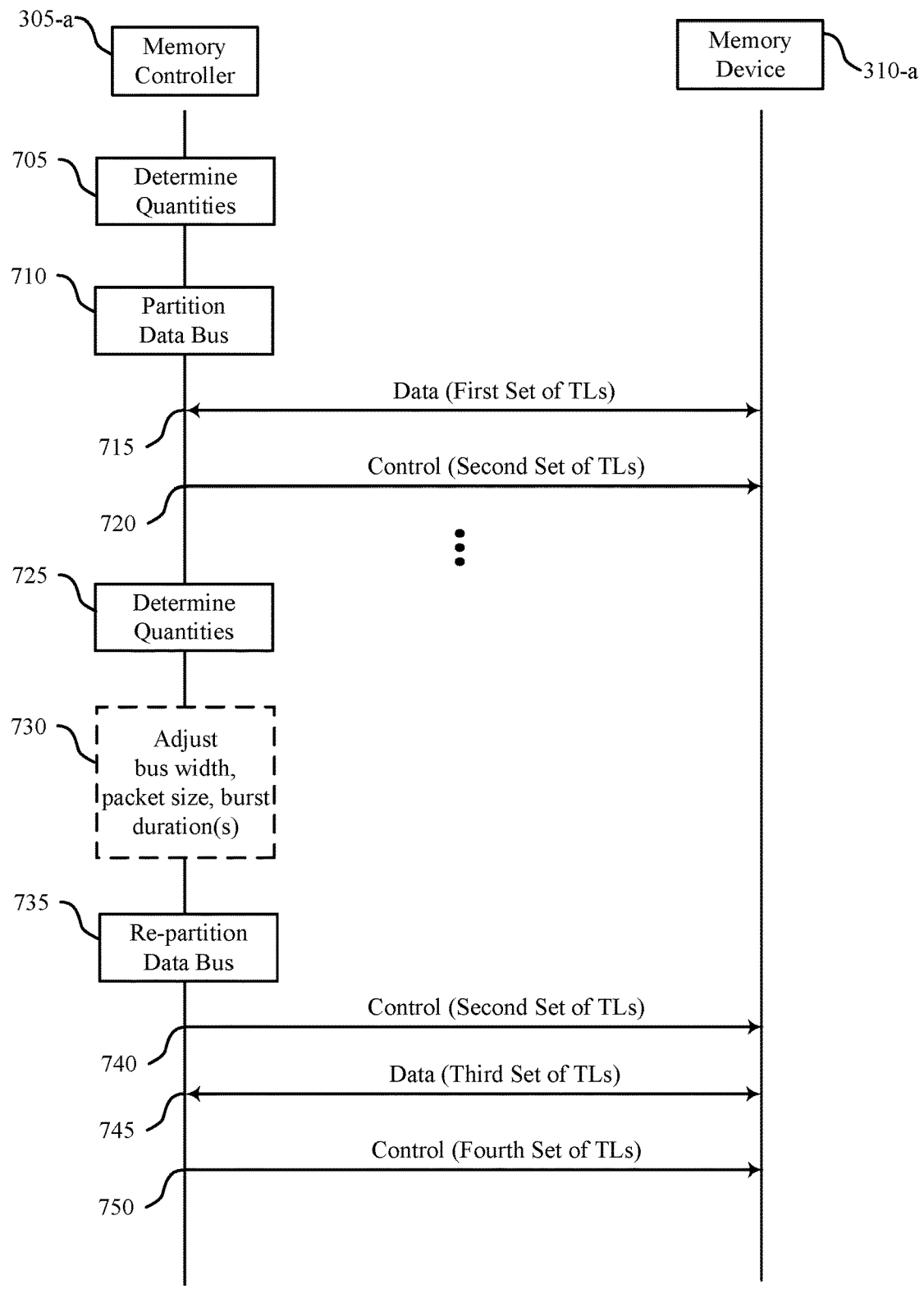
FIGS. 7 and 8 illustrate examples of process flows in accordance with various examples disclosed herein.

FIG. 7 illustrates a process flow 700 in accordance with various examples disclosed herein. Process flow 700 may include actions and operations by a controller 305-a and a memory device 310-a, which may be coupled with a multitude of transmission lines. Prior to step 705, controller 305-a may select some of the transmission lines to be included as at least part of a bus (e.g., a data bus) for communicating data and control content. In some cases, the data bus may be referred to as a combined data and control bus because both data and control may be communicated (e.g., concurrently, simultaneously) via the bus. As used herein, communicating may refer to transmitting or receiving.

At 705, controller 305-a may determine the quantity of data content to be communicated with controller 305-a (e.g., the quantity of data and control content to be communicated in the next x clock cycles, or as part of one or more access operations in response to a request from another component or device). Thus, the memory controller may determine a quantity of data bits and a quantity of control bits associated with memory device 310-a.

At 710, controller 305-a may partition a bus, such as a data bus, into two sets of transmission lines. For example, controller 305-a may select from the data bus a first set of transmission lines and a second set of transmission lines. The first set of transmission lines may, in some cases, be selected based on the quantity of data bits, the quantity of control bits, or both. The second set of transmission lines may, in some cases, be selected based on the quantity of control bits, the quantity of data bits, or both. In some cases, the size of the data bus (e.g., the quantity of transmission lines making up the data bus) may also factor into selecting or configuring the sets of transmission lines. In some cases, the quantity of control bits includes a command for a memory operation. In such cases, controller 305-a may determine a timing parameter (e.g., mandatory delay) associated with the command, and account for the timing parameter when selecting the sets of transmission lines.

In some cases, controller 305-a may partition the data bus at the node-level. For example, controller 305-a may divide the nodes corresponding to the transmission lines into a first set of nodes and a second set of nodes. In such cases, controller 305-a may exchange (e.g., transmit or receive) a first set of data bits to memory device via the first set of nodes and transmit a first set of control bits to memory device 310-a via the second set of nodes.

At 715, controller 305-a may communicate (e.g., transfer or receive) the quantity of data bits, or at least a fraction of the quantity of data bits, over the first set of transmission lines to memory device 310-a. At 720 controller 305-a may transfer the quantity of control bits, or at least a fraction of the control bits, over the second set of transmission lines to memory device 310-a. Communication of the data bits and control bits may occur over the same duration of time (e.g., the data bits and control bits may be communicated during the same x clock cycles). And in some cases, the quantity of data bits and the quantity of control bits may be communicated at the same data rate. Additionally or alternatively, the quantity of data bits and the quantity of control bits may be modulated according to a modulation scheme (e.g., PAM4) that uses three or more voltage levels that each correspond to a symbol representative of more than one bit. Although described with reference to PAM4, the techniques described herein can be implemented using any suitable type of modulation scheme.

In some cases, the quantity of bits may include a command for a memory operation, an address indicating a location for the memory operation, and error detection bits corresponding to the command and address (e.g., error correction bits securing the command and address). In some cases, the command may be an access command (e.g., a read or write command). In such cases, controller 305-a may modify, relative to a previous access command, a quantity of memory cells to be accessed in response to the access command (e.g., controller 305-a may modify the read or write burst length). The modification may be based on the quantity of control bits. In some cases, controller 305-a may select the packet size (e.g., the quantity of data bits) to be communicated based on the quantity of control bits. In such cases, controller 305-a may indicate the quantity of data bits to memory device 310-a.

At 725, controller 305-a may determine new quantities of data and control associated with memory device 310-a. For example, controller 305-a may determine a second quantity of data bits and a second quantity of control bits. Controller 305-a may determine that the new quantities of data and control bits are different than the initial quantities of data and control bits determined at 705. In response to this determination, controller 305-a may, at 730, adjust one or more parameters or configurations. For example, controller 305-a may adjust the width of the data bus by adding or removing transmission lines (e.g., at a logical or conceptual level) from the bus. Additionally or alternative, controller 305-a may adjust the packet size for upcoming access operations (relative to previous access operations). In some cases, controller 305-a may also modify the burst length of an access command.

At 735, controller 305-a may partition (e.g., repartition) the data bus based on the new quantities of control and data. For example, controller 305-a may switch at least one transmission line from the first set of transmission lines to the second set of transmission lines. Such an adjustment may occur in response to determining that the ratio of control bits to data bits has increased relative to a previous ratio. Or controller 305-a may switch at least one transmission line from the second set of transmission lines to the first set of transmission lines. Such an adjustment may occur in response to determining that the ratio of control bits to data bits has decreased relative to a previous ratio. Thus, the sets of transmission lines may be dynamically configured to accommodate new quantities of control and data bits. In some cases, the new sets of transmission lines may be referred to as third and fourth sets of transmission lines.

When controller 305-a is partitioning a data bus at the node-level, partitioning the data bus may include dividing the nodes of the data bus into a third set of nodes and fourth set of nodes. The third and fourth sets of nodes may be different than the first and second sets of nodes, and may be determined based on the new quantities of control and data. In some cases, the third set of nodes may be the first set of nodes plus at least one additional node from the second set of nodes. In such cases, the fourth set of nodes may be the second set of nodes minus the at least one node. In other cases, the third set of nodes may be the first set of nodes minus at least one node. In such cases, the fourth set of nodes may be the second set of nodes plus at least one additional node from the first set of nodes. After determining the third and fourth sets of nodes, controller 305-a may exchange (e.g., transmit or receive) a second set of data bits with memory device 310-a via the third set of nodes and transmit a second set of control bits to memory device 310-a via the fourth set of nodes.

At 740, controller 305-a may transmit control information to memory device 310-a. The control information may indicate one or more of the adjustments made at 730, and/or the control information may indicate the new sets of transmission lines for the repartitioned data bus (e.g., so that memory device 310-a can prepare for upcoming communications). The control information may be transmitted over the second set of transmission lines. At 745, controller 305-a may transmit or receive at least a fraction of the second set of data bits over the third set of transmission lines. And at 750, controller 305-a may transmit at least a fraction of the second set of control bits over the fourth set of transmission lines.

Figure 8:
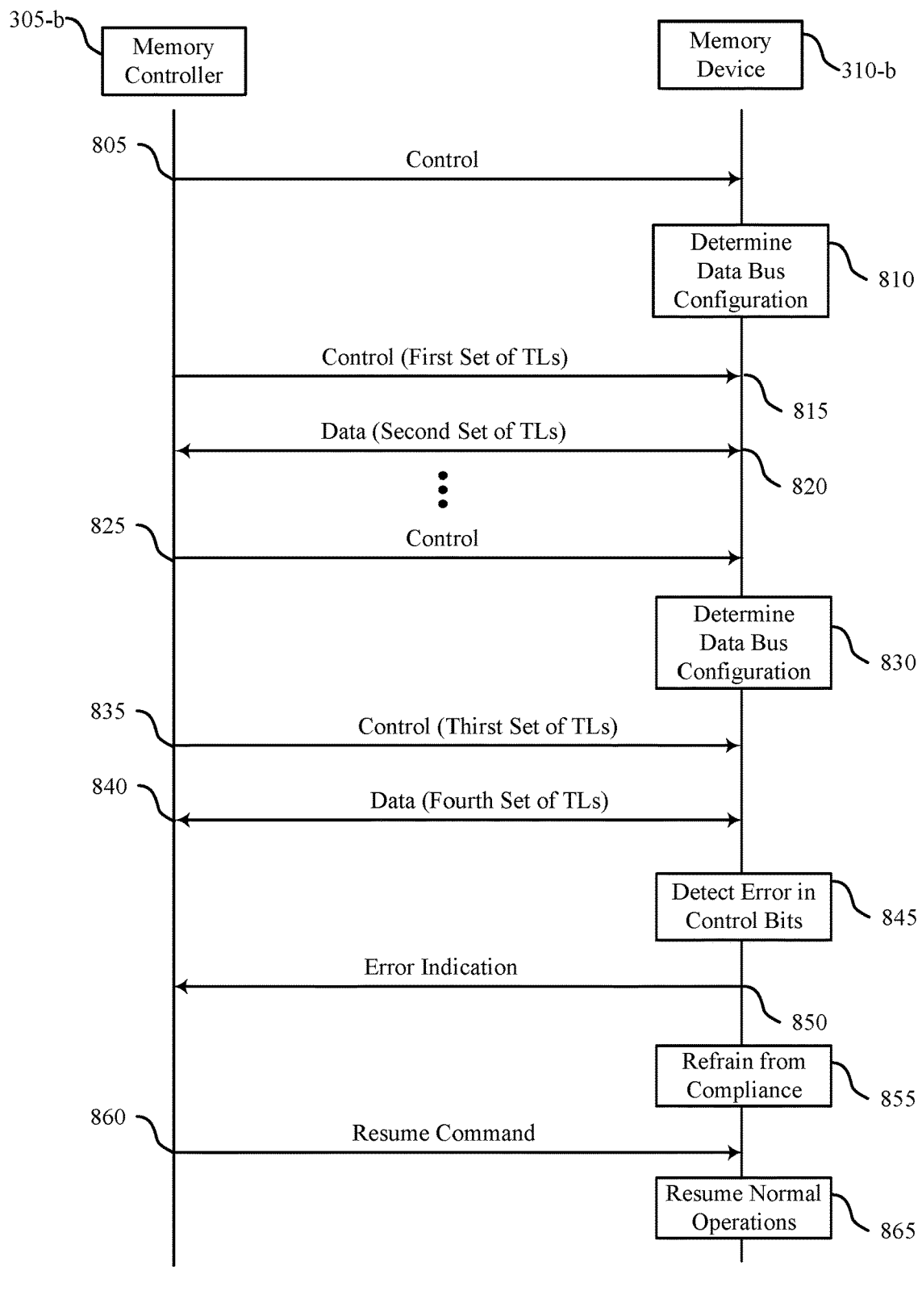

FIG. 8 illustrates a process flow 800 in accordance with various examples disclosed herein. Process flow 800 may include actions and operations by a controller 305-b and a memory device 310-b, which may be coupled with a multitude of transmission lines.

At 805, memory device 310-b may receive control information from controller 305-b. The control information may indicate the configuration of the data bus coupled with controller 305-b and memory device 310-b. For example, the control information may indicate that the data bus has been split into a first set of transmission lines associated with data content and a second set of transmission lines associated with control content. Thus, at 810, memory device 310-b may determine the configuration of the data bus (e.g., memory device 310-b may determine that the data bus has been divided into a first set of transmission lines for control content and a second set of transmission lines for data content).

At 815, memory device 310-b may receive a first set of control bits over the first set of transmission lines. And at 820, memory device 310-b may communicate (e.g., transmit or receive) a first set of data bits over the second set of transmission lines. The first set of control bits may be communicated during the same time period as the first set of data bits, or the first set of control bits and the first set of data bits may be communicated during overlapping time periods. The first set of control bits may be communicated at the same data rate as the first set of data bits.

At 825, memory device 310-b may receive control information from controller 305-b. The control information may be received over the first set of transmission lines or over a different data bus. The control information may indicate the type of content associated with each transmission line. For example, the control information may indicate that the data bus has been reconfigured (e.g., repartitioned) into a third set of transmission lines associated with control content and a fourth set of transmission lines associated with data content. The control information may indicate which transmission lines are in each set. Thus, at 830, memory device 310-b may determine the new configuration of the data bus (e.g., memory device 310-b may determine that the data bus has been divided into a third set of transmission lines for control content and a fourth set of transmission lines for data content).

In some cases, the control information may also indicate adjustments in various communication and access parameters. For example, the control information may include a command that changes the quantity of memory cells to be read or written in response to an access command (e.g., the read burst length or write burst length may be changed from a first quantity of bits to a second quantity of bits). Additionally or alternatively, the control information may include an indication that the packet size associated with upcoming access operations is different than a packet size associated with previous access operations. In some cases, the control information may also indicate that the size of the data bus has been modified.

At 835, memory device 310-b may communicate a second set of control bits over the third set of transmission lines. And at 840, memory device 310-b may communicate a second set of data over the fourth set of transmission lines. The second sets of control and data bits may be transmitted at the same data rate. In such cases, the control bits may be secured with error detection and correction bits (e.g., CRC or parity bits). Thus, memory device 310-b may receive over the third set of transmission lines a set of error detection bits in the second set of control bits.

In some cases, at 845, memory device 310-b may determine that the second set of control bits has an error based on the set of error detection bits. In response to this determination, memory device 310-b may, at 850, send an indication of the error to controller 305-b. Memory device 310-b may also disregard the command associated with the error. In some cases, memory device 310-b may also, at 855, refrain from complying with additional commands for memory operations from controller 305-b until controller 305-b transmits a resume command. For example, memory device 310-b may enter a locked state and close all banks (after the timing conditions for closing the banks are met). Memory device 310-b may also autonomously enter a self-refresh mode and retain relevant data content (e.g., while controller 305-b handles the error). At 860, memory device 310-b may receive from controller 305-b a resume command indicating that the error has been resolved and/or that memory device 310-b can resume normal operations. Accordingly, at 865, memory device 310-b may (e.g., in response to the resume command) resume normal operations.

Figure 9:
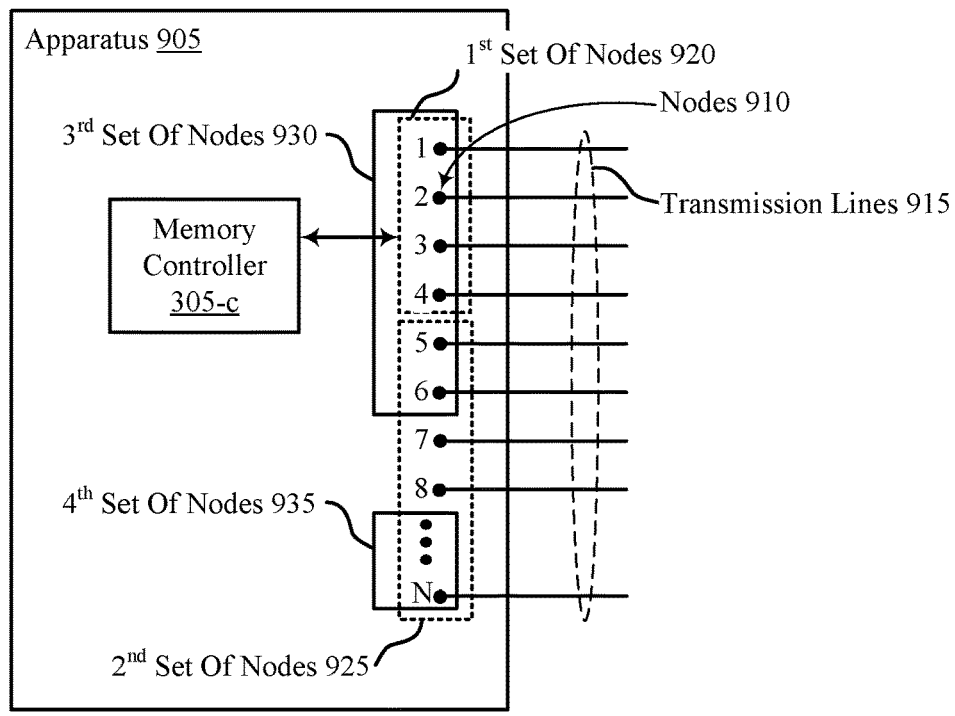
FIGS. 9 and 10 show block diagrams of apparatuses in accordance with various examples disclosed herein.

FIG. 9 shows block diagram 900 of an apparatus 905 in accordance with various examples disclosed herein. The apparatus 905 may include nodes 910 configured to communicate with a memory device via transmission lines 915. The transmission lines may make up a data bus. The apparatus may also include a controller 305-c that is coupled with the nodes 910. The controller 305-c may be an example of an external memory controller 105 (also referred to as a host or host device) or a processor 120 (e.g., a GPU, a GPGPU, a CPU), as described with reference to FIG. 1.

The controller 305-c may be configured or operable to divide the nodes 910 into a first set of nodes 920 (e.g., nodes 1 through 4) and a second set of nodes 925 (e.g., nodes 5 through N). The controller 305-c may be configured or operable to transmit a first set of control bits to the memory device via the first set of nodes 920 and exchange a first set of data bits with the memory device via the second set of nodes 925.

The controller 305-c may be configured or operable to divide the nodes 910 into a third set of nodes 930 and a fourth set of nodes 935 different than the first and second sets of nodes. For example, the third set of nodes 935 may include the first set of nodes 920 plus one or more additional nodes (e.g., nodes 4 and 5) from the second set of nodes 925. In such an example, the fourth set of nodes 935 may include the second set of nodes 925 minus one or more nodes (e.g., minus the nodes switched to the third set of nodes 930). In other examples, the third set of nodes 930 may be the first set of nodes 920 minus one or more nodes, and the fourth set of nodes 935 may be the second set of nodes 925 plus one or more nodes from the first set of nodes 920.

In some cases, the controller 305-c may be configured or operable to determine a quantity of the first set of control bits and a quantity of the first set of data bits. In such cases dividing the nodes 910 into the first and second sets of nodes is based at least in part on the quantity of the first set of control bits and the quantity of the first set of data bits.

Figure 10:
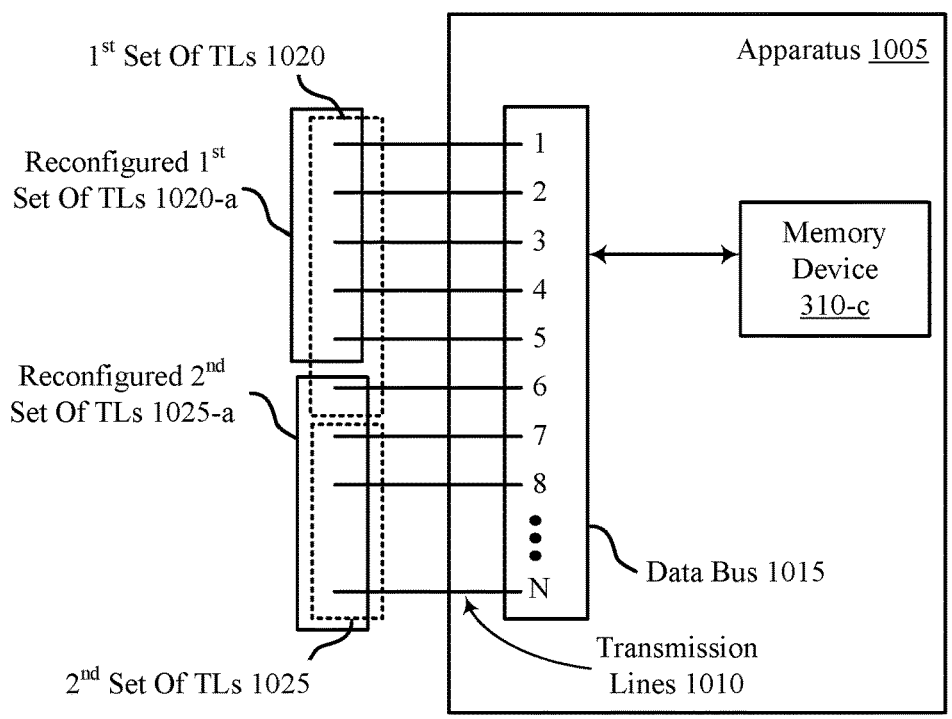

FIG. 10 shows a block diagram 1000 of an apparatus 1005 in accordance with various examples disclosed herein. The apparatus 1005 may include transmission lines 1010 configured as a data bus 1015. Each transmission line 1010 may connect to the apparatus 1005 via a node. The apparatus 1005 may also include a memory device 310-c that is coupled with the transmission lines 1010. The memory device 310-c may be an example of a memory device 110, device memory controller 155, memory die 160, or local memory controller 165 as described with reference to FIG. 1. In some cases, the data bus 1015 may be referred to as a combined data and control bus because a fraction of the transmission lines 1010 may be configured to operate as a control bus (e.g., a data bus for communicating control information) while the remaining transmission lines 1010 may be configured to operate as a data bus (e.g., a data bus for communicating data information).

The memory device 310-c may be configured or operable to determine that the data bus 1015 has been divided into a first set of transmission lines 1020 (e.g., transmission lines 1 through 6) and a second set of transmission lines 1025 (e.g., transmission lines 7 through N). The memory device 310-*c* may be configured or operable to receive a first set of control bits from a memory controller over the first set of transmission lines 1020 and exchange a first set of data bits with the memory controller over the second set of transmission lines 1025.

The memory device 310-*c* may be configured or operable to determine that at least one transmission line 1010 has been switched from the first set of transmission lines 1020 to the second set of transmission lines 1025. For example, memory device 310-*c* may determine that transmission line 6 has been switched from the first set of transmission lines 1020 to the second set of transmission lines 1025-*a*. Thus, the memory device 310-*c* may determine that the reconfigured first set of transmission lines 1020-*a* is the first set of transmission lines 1020 minus at least one transmission line 1010. And the memory device 310-*c* may determine that the reconfigured second set of transmission lines 1025-*a* is the second set of transmission lines 1025 plus at least one transmission line 1010 from the first set of transmission lines 1020.

Accordingly, the memory device 310-*c* may exchange a second set of data bits with the memory controller over the transmission line 1010 (e.g., transmission line 6) switched to the second set of transmission lines. Memory device 310-*c* may also receive a second set of control bits from the memory controller over transmission lines 1010 of the first set of transmission lines 1020 other than the transmission line switched to the second set of transmission lines (e.g., memory device 310-*c* may also receive a second set of control bits from the memory controller over the reconfigured first set of transmission lines 1020-*a*).

In some cases, the memory device 310-*c* may receive (e.g., from the memory controller) an indication of the first and second sets of transmission lines. In such cases, the determination that the data bus has been divided into the first and second sets of transmission lines may be based at least in part on the indication. In some cases, the memory device 310-*c* may receive (e.g., from the memory controller) an indication that the transmission line has been switched. In such cases, the determination that the at least one transmission line has been switched may be based at least in part on the indication.

Figure 11:
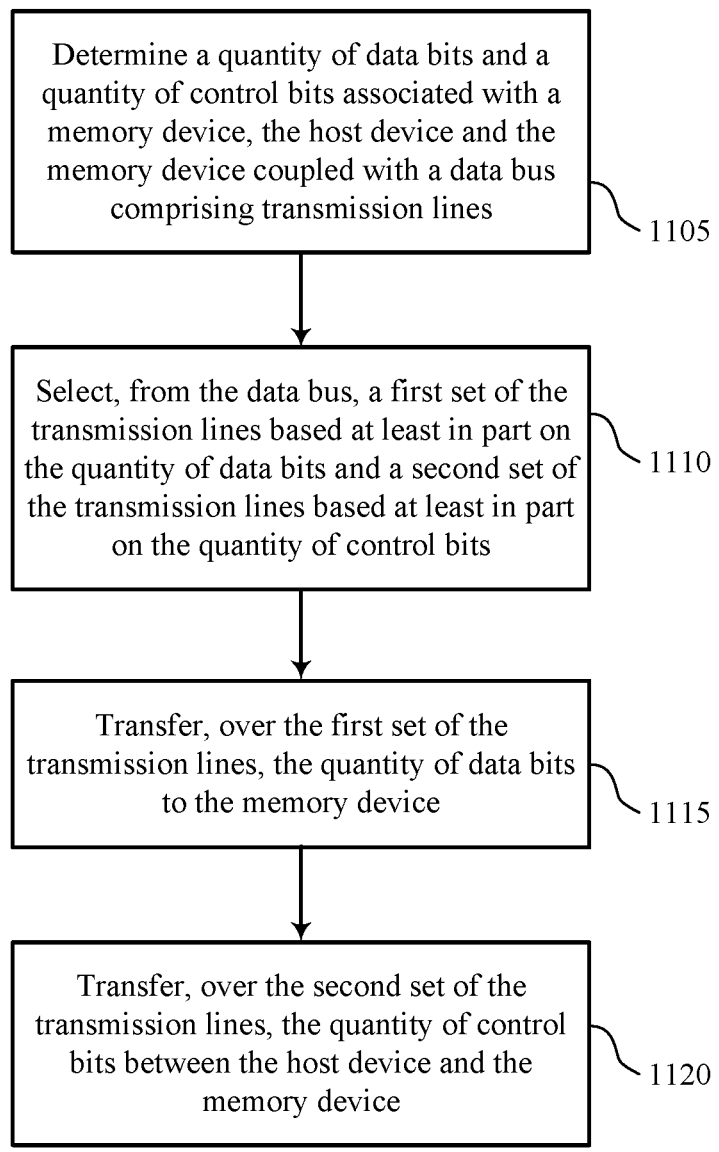
FIGS. 11 and 12 show flowcharts illustrating a method or methods in accordance with various examples disclosed herein.

FIG. 11 shows a flowchart illustrating a method 1100 in accordance with various examples disclosed herein. The operations of method 1100 may be implemented by an apparatus or its components as described herein. For example, the operations of method 1100 may be performed by a memory controller or host device as described with reference to FIGS. 1 through 8. In some examples, a memory controller or host device may execute a set of instructions to control the functional elements of a device to perform the functions described below. Additionally or alternatively, a memory controller or host device may perform aspects of the functions described below using special-purpose hardware.

At 1105, the method may include determining, by a host device, a quantity of data bits and a quantity of control bits associated with a memory device. The operations of 1105 may be performed according to the methods described with reference to FIGS. 3 through 8. In some examples, aspects of the operations of 1105 may be performed by a memory controller as described with reference to FIGS. 3 through 9.

At 1110, the method may include determining, selecting, from the data bus, a first set of the transmission lines based at least in part on the quantity of data bits and a second set of the transmission lines based at least in part on the quantity of control bits. The operations of 1110 may be performed according to the methods described with reference to FIGS. 3 through 8. In some examples, aspects of the operations of 1110 may be performed by a memory controller as described with reference to FIGS. 3 through 9.

At 1115, the method may include transferring, over the first set of the transmission lines, the quantity of data bits to the memory device. The operations of 1115 may be performed according to the methods described with reference to FIGS. 3 through 8. In some examples, aspects of the operations of 1115 may be performed by a memory controller as described with reference to FIGS. 3 through 9.

At 1120, the method may include transferring, over the second set of the transmission lines, the quantity of control bits between the host device and the memory device. The operations of 1120 may be performed according to the methods described with reference to FIGS. 3 through 8. In some examples, aspects of the operations of 1120 may be performed by a memory controller as described with reference to FIGS. 3 through 9.

In some examples, an apparatus as described herein may perform a method or methods, such as the method 1100. The apparatus may include features, means, or instructions (e.g., a non-transitory computer-readable medium storing instructions executable by a processor) for determining a quantity of data bits and a quantity of control bits associated with a memory device, the host device and the memory device coupled with a data bus comprising transmission lines; selecting, from the data bus, a first set of the transmission lines based at least in part on the quantity of data bits and a second set of the transmission lines based at least in part on the quantity of control bits; transferring, over the first set of the transmission lines, the quantity of data bits to the memory device; and transferring, over the second set of the transmission lines, the quantity of control bits between the host device and the memory device.

When the quantity of control bits includes a first quantity of control bits and the quantity of data bits includes a first quantity of data bits, the method, apparatuses, and non-transitory computer-readable medium described herein may further include operations, features, means, or instructions for 1) determining a second quantity of data bits and a second quantity of control bits associated with the memory device and 2) switching at least one transmission line from one of the first or second sets of transmission lines to the other set based at least in part on the second quantity of data and control bits.

When the quantity of control bits includes a command for a memory operation, the method, apparatuses, and non-transitory computer-readable medium described herein may further include operations, features, means, or instructions for determining a timing parameter associated with the command, wherein selecting the first and second sets of transmission lines is based at least in part on the timing parameter.

Some examples of the method, apparatuses, and non-transitory computer-readable medium described herein may further include operations, features, means, or instructions for transferring the quantity of control bits and the quantity of data bits at a same data rate.

Some examples of the method, apparatuses, and non-transitory computer-readable medium described herein may further include operations, features, means, or instructions for transferring a command for a memory operation, an address indicating a memory location targeted for the memory operation, and error detection bits corresponding to the command and address. When the command is an access command, the method, apparatuses, and non-transitory computer-readable medium described herein may further include operations, features, means, or instructions for modifying, relative to a previous access command and based at least in part on the quantity of control bits, a quantity of memory cells to be accessed in response to the access command.

Some examples of the method, apparatuses, and non-transitory computer-readable medium described herein may further include operations, features, means, or instructions for selecting the quantity of data bits based at least in part on the quantity of control bits and sending an indication of the quantity of data bits to the memory device.

When the quantity of data bits includes a first quantity of data bits, the method, apparatuses, and non-transitory computer-readable medium described herein may further include operations, features, means, or instructions for determining that a second quantity of data bits associated with the memory device is different than the first quantity of data bits and adjusting the data bus by adding or removing one or more transmission lines from the data bus based at least in part on determining the second quantity of data bits. In such cases, the method, apparatuses, and non-transitory computer-readable medium described herein may further include operations, features, means, or instructions for transmitting an indication of the adjusted data bus over the second set of the transmission lines.

Some examples of the method, apparatuses, and non-transitory computer-readable medium described herein may further include operations, features, means, or instructions for modulating the quantity of control bits and the quantity of data bits according to a modulation scheme that includes three or more voltage levels.

Figure 12:
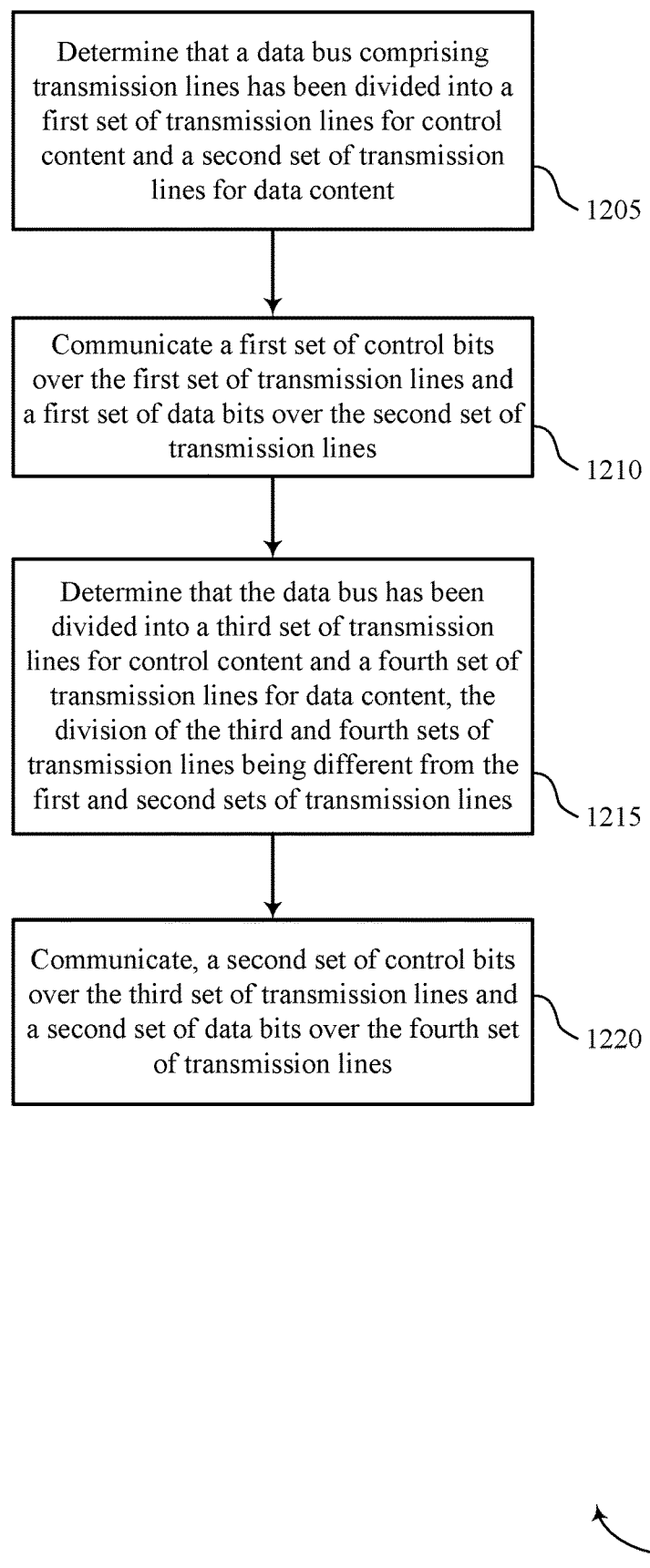

FIG. 12 shows a flowchart illustrating a method 1200 in accordance with various examples disclosed herein. The operations of method 1200 may be implemented by an apparatus or its components as described herein. For example, the operations of method 1200 may be performed by a memory device as described with reference to FIGS. 1 through 8. In some examples, a memory device may execute a set of instructions to control the functional elements of a device to perform the functions described below. Additionally or alternatively, a memory device may perform aspects of the functions described below using special-purpose hardware.

At 1205, the method may include determining, by a memory device, that a data bus including transmission lines has been divided into a first set of transmission lines for control content and a second set of transmission lines for data content. The operations of 1205 may be performed according to the methods described with reference to FIGS. 3 through 8. In some examples, aspects of the operations of 1205 may be performed by a memory device as described with reference to FIGS. 3 through 8 and 10.

At 1210, the method may include communicating a first set of control bits over the first set of transmission lines and a first set of data bits over the second set of transmission lines. The operations of 1210 may be performed according to the methods described with reference to FIGS. 3 through 8. In some examples, aspects of the operations of 1210 may be performed by a memory device as described with reference to FIGS. 3 through 8 and 10.

At 1215, the method may include determining that the data bus has been divided into a third set of transmission lines for control content and a fourth set of transmission lines for data content, the division of the third and fourth sets of transmission lines being different than the first and second sets of transmission lines. The operations of 1215 may be performed according to the methods described with reference to FIGS. 3 through 8. In some examples, aspects of the operations of 1215 may be performed by a memory device as described with reference to FIGS. 3 through 8 and 10.

At 1220, the method may include communicating, a second set of control bits over the third set of transmission lines and a second set of data bits over the fourth set of transmission lines. The operations of 1220 may be performed according to the methods described with reference to FIGS. 3 through 8. In some examples, aspects of the operations of 1220 may be performed by a memory device as described with reference to FIGS. 3 through 8 and 10.

In some examples, an apparatus as described herein may perform a method or methods, such as the method 1200. The apparatus may include features, means, or instructions (e.g., a non-transitory computer-readable medium storing instructions executable by a processor) for determining, by a memory device, that a data bus including transmission lines has been divided into a first set of transmission lines for control content and a second set of transmission lines for data content; communicating a first set of control bits over the first set of transmission lines and a first set of data bits over the second set of transmission lines; determining that the data bus has been divided into a third set of transmission lines for control content and a fourth set of transmission lines for data content, the division of the third and fourth sets of transmission lines being different than the first and second sets of transmission lines; and communicating, a second set of control bits over the third set of transmission lines and a second set of data bits over the fourth set of transmission lines.

Some examples of the method, apparatuses, and non-transitory computer-readable medium described herein may further include operations, features, means, or instructions for receiving, over the third set of transmission lines, a set of error detection bits included in the second set of control bits and determining that the second set of control bits comprises an error based at least in part on the set of error detection bits. In such cases, the method, apparatuses, and non-transitory computer-readable medium described herein may further include operations, features, means, or instructions for transmitting an indication of the error to a memory controller coupled with the data bus. Additionally or alternatively, the method, apparatuses, and non-transitory computer-readable medium described herein may further include operations, features, means, or instructions for refraining, based at least in part on determining the error, from complying with additional commands for memory operations until receiving an indication from a memory controller coupled with the data bus.

Some examples of the method, apparatuses, and non-transitory computer-readable medium described herein may further include operations, features, means, or instructions for receiving a command that changes a quantity of memory cells to be read or written in response to an access command from a first quantity to a second quantity and reading or writing a set of memory cells corresponding to the second quantity in response to an access command included in the first set of control bits.

Some examples of the method, apparatuses, and non-transitory computer-readable medium described herein may further include operations, features, means, or instructions for receiving, after communicating the second set of control bits and second set of data bits, an indication that a quantity of transmission lines included in the data bus has changed and determining that the data bus has been divided into a fifth set of transmission lines associated with control content and a sixth set of transmission lines associated with data content. In such cases, the method, apparatuses, and non-transitory computer-readable medium described herein may further include operations, features, means, or instructions for communicating a third set of control bits over the fifth set of transmission lines and a fourth set of data bits over the sixth set of transmission lines.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" and "coupled with" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   determining, by a host device, a quantity of data bits and a quantity of control bits associated with a memory device, the host device and the memory device coupled with a data bus comprising transmission lines;
   selecting, from the data bus, a first set of the transmission lines based at least in part on the quantity of data bits and a second set of the transmission lines based at least in part on the quantity of control bits;
   transferring, over the first set of the transmission lines, the quantity of data bits to the memory device; and
   transferring, over the second set of the transmission lines, the quantity of control bits between the host device and the memory device.

2. The method of claim 1, wherein the quantity of control bits comprises a first quantity of control bits and the quantity of data bits comprises a first quantity of data bits, the method further comprising:
   determining a second quantity of data bits and a second quantity of control bits associated with the memory device; and
   switching at least one transmission line from one of the first or second sets of transmission lines to the other set based at least in part on the second quantity of data and control bits.

3. The method of claim 1, wherein the quantity of control bits comprises a command for a memory operation, the method further comprising:
   determining a timing parameter associated with the command, wherein selecting the first and second sets of transmission lines is based at least in part on the timing parameter.

4. The method of claim 1, further comprising:
   transferring the quantity of control bits and the quantity of data bits at a same data rate.

5. The method of claim 1, further comprising:
   transferring a command for a memory operation, an address indicating a memory location targeted for the memory operation, and error detection bits corresponding to the command and the address.

6. The method of claim 5, wherein the command comprises an access command, the method further comprising:
modifying, relative to a previous access command and based at least in part on the quantity of control bits, a quantity of memory cells to be accessed in response to the access command.

7. The method of claim 1, further comprising:
selecting the quantity of data bits based at least in part on the quantity of control bits; and
sending an indication of the quantity of data bits to the memory device.

8. The method of claim 1, wherein the quantity of data bits comprises a first quantity of data bits, the method further comprising:
determining that a second quantity of data bits associated with the memory device is different than the first quantity of data bits; and
adjusting the data bus by adding or removing one or more transmission lines from the data bus based at least in part on determining the second quantity of data bits.

9. The method of claim 8, further comprising:
transmitting an indication of the adjusted data bus over the second set of the transmission lines.

10. The method of claim 1, further comprising:
modulating the quantity of control bits and the quantity of data bits according to a modulation scheme that includes three or more voltage levels.

11. A method, comprising:
determining, by a memory device, that a data bus comprising transmission lines has been divided into a first set of transmission lines for control content and a second set of transmission lines for data content;
communicating a first set of control bits over the first set of transmission lines and a first set of data bits over the second set of transmission lines;
determining that the data bus has been divided into a third set of transmission lines for control content and a fourth set of transmission lines for data content, the division of the third and fourth sets of transmission lines being different than the first and second sets of transmission lines; and
communicating, a second set of control bits over the third set of transmission lines and a second set of data bits over the fourth set of transmission lines.

12. The method of claim 11, further comprising:
receiving, over the third set of transmission lines, a set of error detection bits included in the second set of control bits; and
determining that the second set of control bits comprises an error based at least in part on the set of error detection bits.

13. The method of claim 12, further comprising:
transmitting an indication of the error to a memory controller coupled with the data bus.

14. The method of claim 12, further comprising:
refraining, based at least in part on determining the error, from complying with additional commands for memory operations until receiving an indication from a memory controller coupled with the data bus.

15. The method of claim 11, further comprising,
receiving a command that changes a quantity of memory cells to be read or written in response to an access command from a first quantity to a second quantity; and
reading or writing a set of memory cells corresponding to the second quantity in response to the access command included in the first set of control bits.

16. The method of claim 11, further comprising:
receiving, after communicating the second set of control bits and the second set of data bits, an indication that a quantity of transmission lines included in the data bus has changed; and
determining that the data bus has been divided into a fifth set of transmission lines associated with control content and a sixth set of transmission lines associated with data content.

17. The method of claim 16, further comprising:
communicating a third set of control bits over the fifth set of transmission lines and a fourth set of data bits over the sixth set of transmission lines.

18. An apparatus, comprising:
nodes configured to communicate with a memory device via transmission lines; and
a memory controller coupled with the nodes and operable to:
divide the nodes into a first set of nodes and a second set of nodes;
transmit a first set of control bits to the memory device via the first set of nodes and exchange a first set of data bits with the memory device via the second set of nodes;
divide the nodes into a third set of nodes and a fourth set of nodes different than the first and second sets of nodes; and
transmit a second set of control bits to the memory device via the third set of nodes and exchange a second set of data bits with the memory device via the fourth set of nodes.

19. The apparatus of claim 18, wherein the memory controller is further operable to:
determine a quantity of the first set of control bits and a quantity of the first set of data bits, wherein dividing the nodes into the first and second sets of nodes is based at least in part on the quantity of the first set of control bits and the quantity of the first set of data bits.

20. The apparatus of claim 18, wherein the third set of nodes comprises the first set of nodes plus at least one node, and wherein the fourth set of nodes comprises the second set of nodes minus the at least one node.

21. An apparatus, comprising:
transmission lines configured as a data bus; and
a memory device coupled with the transmission lines and operable to:
determine that the data bus has been divided into a first set of transmission lines and a second set of transmission lines;
receive a first set of control bits from a memory controller over the first set of transmission lines and exchange a first set of data bits with the memory controller over the second set of transmission lines;
determine that a transmission line has been switched from the first set of transmission lines to the second set of transmission lines; and
exchange a second set of data bits with the memory controller over the transmission line switched to the second set of transmission lines.

22. The apparatus of claim 21, wherein the memory device is operable to:
receive a second set of control bits from the memory controller over transmission lines of the first set of transmission lines other than the transmission line switched to the second set of transmission lines.

23. The apparatus of claim 21, wherein the memory device is operable to:
- receive, from the memory controller, an indication of the first and second sets of transmission lines, wherein the determination that the data bus has been divided into the first and second sets of transmission lines is based at least in part on the indication.

24. The apparatus of claim 21, wherein the memory device is operable to:
- receive, from the memory controller, an indication that the transmission line has been switched, wherein the determination that the transmission line has been switched is based at least in part on the indication.

* * * * *